US007339351B2

(12) United States Patent  
Murakami et al.

(10) Patent No.: US 7,339,351 B2
(45) Date of Patent: Mar. 4, 2008

(54) METHOD AND APPARATUS FOR ESTIMATING REMAINING CAPACITY OF SECONDARY BATTERY

(75) Inventors: Yusai Murakami, Hamamatsu (JP); Masahiro Takada, Hamana-gun (JP); Teruyoshi Egoshi, Toyohashi (JP); Norito Yamabe, Toyohashi (JP)

(73) Assignee: Panasonic EV Energy Co., Ltd., Shizuoka (JP)

( * ) Notice: Subject to any disclaimer, the term of this patent is extended or adjusted under 35 U.S.C. 154(b) by 328 days.

(21) Appl. No.: 10/496,426

(22) PCT Filed: Dec. 2, 2002

(86) PCT No.: PCT/JP02/12614

§ 371 (c)(1),
(2), (4) Date: May 20, 2004

(87) PCT Pub. No.: WO03/061055

PCT Pub. Date: Jul. 24, 2003

(65) Prior Publication Data

US 2005/0017725 A1  Jan. 27, 2005

(30) Foreign Application Priority Data

Dec. 27, 2001  (JP)  ............................. 2001-398111

(51) Int. Cl.
*H01M 10/44* (2006.01)
*H01H 10/46* (2006.01)
(52) U.S. Cl. ..................................... 320/132
(58) Field of Classification Search ................ 320/132, 320/149; 324/426, 427, 430, 433
See application file for complete search history.

(56) References Cited

U.S. PATENT DOCUMENTS

| 5,561,362 | A | * | 10/1996 | Kawamura et al. | ......... 320/134 |
| 5,650,712 | A | * | 7/1997 | Kawai et al. | ............... 324/427 |
| 5,703,469 | A | | 12/1997 | Kinoshita | |
| 6,275,008 | B1 | | 8/2001 | Arai et al. | |
| 2001/0021092 | A1 | * | 9/2001 | Astala | ........................ 320/134 |
| 2001/0035738 | A1 | | 11/2001 | Laig-Horstebrock et al. | |

FOREIGN PATENT DOCUMENTS

| JP | 7-191109 | 7/1995 |
| JP | 10-274670 | 10/1998 |
| JP | 2000-12102 | 1/2000 |
| JP | 2000-65906 | 3/2000 |
| JP | 2001-339863 | 12/2001 |
| KR | 2000-0074392 | 12/2000 |

* cited by examiner

*Primary Examiner*—Edward H Tso
(74) *Attorney, Agent, or Firm*—Workman Nydegger

(57) ABSTRACT

There is provided a battery pack system with estimation accuracy of a remaining capacity of a secondary batter enhanced. A current accumulation coefficient correction section 109 calculates a correction amount α with respect to a current accumulation coefficient k in accordance with a battery electromotive force Veq from an electromotive force calculation section 105. A remaining capacity calculation section 112 estimates a remaining capacity SOC by current accumulation, based on the current accumulation coefficient k calculated from a correction amount α, and a charging efficiency η based on a currently estimated remaining capacity calculated by a charging efficiency calculation section 110.

8 Claims, 12 Drawing Sheets

METHOD AND APPARATUS FOR ESTIMATING REMAINING CAPACITY OF SECONDARY BATTERY

TECHNICAL FIELD

The present invention relates to a method for estimating a remaining capacity (SOC: State of Charge) of a secondary battery such as a nickel-metal hydride (Ni—MH) battery to be mounted as a power source for a motor and a driving source for various loads, in motor-driven vehicles such as a pure electric vehicle (PEV), a hybrid electric vehicle (HEV), a hybrid vehicle with a fuel battery and a battery, or the like.

BACKGROUND ART

Conventionally, in an HEV, when an output from an engine is large with respect to motive power required for driving, an electric generator is driven with surplus motive power to charge a secondary battery. On the other hand, when an output from an engine is small, a motor is driven with the electric power from a secondary battery to output supplementary motive power. In this case, a secondary battery is discharged. When a secondary battery is mounted on an HEV or the like, it is necessary to maintain an appropriate operation state by controlling such charging/discharging, etc.

For this purpose, the voltage, current, temperature, and the like of a secondary battery are detected, and the remaining capacity (hereinafter, abbreviated as an "SOC") of the secondary battery is estimated by computation, whereby an SOC is controlled so as to optimize the fuel consumption efficiency of a vehicle. Furthermore, at this time, in order to allow a power assist based on motor driving during acceleration to be operated and to allow energy to be collected (regenerative braking) during deceleration with good balance, an SOC level is controlled as follows. Generally, in order to set an SOC to be, for example, in a range of 50% to 70%, when the SOC decreases to, for example, 50%, control for excess charging is performed. On the other hand, when the SOC increases to, for example, 70%, control for excess discharging is performed. Thus, it is attempted to approximate the SOC to the center of control.

In order to control the SOC exactly, it is necessary to exactly estimate the SOC of a secondary battery that is being charged/discharged. Examples of such a conventional method for estimating an SOC include the following two kinds of methods.

(1) A charging/discharging current is measured. The value of the current (having a minus sign in the case of charging, and having a plus sign in the case of discharging) is multiplied by a charging efficiency. The multiplied values are accumulated over a certain period of time to calculate an accumulated capacity. Then, an SOC is estimated based on the accumulated capacity.

(2) A plurality of data sets of charging/discharging currents and terminal voltages of a secondary battery corresponding thereto are measured and stored. A primary approximate line (voltage V—current I approximate line) is obtained from the data sets by least squares, and a voltage value (V intercept of a V-I approximate line) corresponding to a current value 0 (zero) is calculated as a no-load voltage (V0). Then, an SOC is estimated based on the no-load voltage V0.

Furthermore, when a secondary battery is charged/discharged, a polarization voltage is generated with respect to a battery electromotive force. More specifically, a voltage increases during charging, whereas a voltage decreases during discharging. This change is called a polarization voltage. In the case of estimating an SOC from a voltage as in the above-mentioned method (2), in the case of estimating an increase and a decrease in a voltage during predetermined time, and in the case of obtaining electric power that can be input/output during predetermined time, it is necessary to grasp a polarization voltage exactly.

In general, as a method for estimating a polarization voltage, a primary regression line is obtained from a plurality of current and voltage data, the slope of the line is set to be a polarization resistance (component resistance, reaction resistance, and diffusion resistance), and the polarization resistance is multiplied by a current to obtain a polarization voltage.

However, the above-mentioned two kinds of conventional SOC estimation methods have the following problems.

First, in the case of the SOC estimation method based on an accumulated capacity in the above method (1), a charging efficiency required for accumulating current values depends upon an SOC value, a current value, a temperature, and the like. Therefore, it is difficult to find a charging efficiency suitable for these various kinds of conditions. Furthermore, in the case where a battery is being left, a self-discharge amount during that time cannot be calculated. For these reasons and the like, the difference between the true value of an SOC and the estimated value thereof increases with the passage of time. Therefore, in order to eliminate this, it is necessary to perform complete discharging or fill charging to initialize the SOC.

However, in the case where a secondary battery is mounted on an HEV, when complete discharging is performed, the secondary battery cannot supply electric power, which becomes a burden on an engine. Therefore, it is necessary to charge a secondary battery over a predetermined period of time until it is fully charged after stopping a vehicle at a charging site and the like and completely discharging the secondary battery. Thus, in the case of the application to an HEV, it is impossible to perform complete charging/discharging during driving of a vehicle so as to initialize an SOC. Furthermore, to periodically perform complete charging/discharging of a secondary battery mounted on an HEV is inconvenient for a user, and also becomes a burden on the user.

Next, in the case of the SOC estimation method based on a no-load voltage in the above method (2), first, a V intercept of a V-I approximate line after large discharging becomes relatively low, and a V intercept of the V-I approximate line after large charging becomes relatively high. Thus, a no-load voltage is varied even at the same SOC, depending upon the past history of a charging/discharging current. This change is caused by a polarization voltage. Accordingly, the no-load voltage that is a V intercept of a V-I approximate line is varied between a charging direction and a discharging direction, due to the factor of a polarization voltage. Because of this, the difference in voltage turns to be an estimation error of an SOC. Furthermore, a decrease in voltage due to a memory effect and leaving of a battery, battery degradation, and the like also cause an estimation error of an SOC.

Furthermore, according to the above-mentioned conventional method for estimating a polarization voltage, when a polarization voltage is obtained by a polarization resistance, a reaction resistance due to the reaction between an active material of a battery and an interface of an electrolyte solution and a diffusion resistance due to the reaction in active materials, between active materials, and in an electrolyte solution, included in a polarization resistance, cannot be estimated sufficiently. Therefore, the accuracy of an estimated polarization voltage is unsatisfactory. Accordingly, it is not practical to use a no-load voltage in the above method (2) for correction, in order to obtain a battery electromotive force for estimating an SOC.

DISCLOSURE OF INVENTION

The present invention has been achieved in view of the above problems, and its object is to provide a method and apparatus for estimating an SOC with high accuracy, without periodically performing complete charging/discharging of a secondary battery to initialize the SOC; a battery pack system with a computer system (electronic control unit for a battery (battery ECU)) for performing processing in the method mounted thereon; and a motor-driven vehicle with the battery pack system mounted thereon.

In order to achieve the above-mentioned object, a first method for estimating a remaining capacity of a secondary battery according to the present invention includes the steps of: measuring data sets of a current flowing through a secondary battery and a terminal voltage of the secondary battery corresponding to the current, and obtaining a plurality of the data sets; calculating an electromotive force of the secondary battery based on the obtained plurality of data sets; determining a correction amount with respect to a current accumulation coefficient in accordance with the calculated electromotive force; calculating the current accumulation coefficient from the correction amount and a charging efficiency; and multiplying the calculated current accumulation coefficient by the measured current, and estimating a remaining capacity of the secondary battery by current accumulation.

In order to achieve the above-mentioned object, a second method for estimating a remaining capacity of a secondary battery according to the present invention includes the steps of: measuring data sets of a current flowing through a battery pack including a combination of a plurality of cells that are secondary batteries and used in an intermediately charged state and a terminal voltage of the secondary battery corresponding to the current, and obtaining a plurality of the data sets; calculating an electromotive force of the secondary battery based on the obtained plurality of data sets; determining a correction amount with respect to a current accumulation coefficient in accordance with the calculated electromotive force; calculating the current accumulation coefficient from the correction amount and a charging efficiency; and multiplying the calculated current accumulation coefficient by the measured current, and estimating a remaining capacity of the secondary battery by current accumulation.

According to the above-mentioned methods, the current accumulation coefficient is corrected in accordance with a battery electromotive force and an SOC is estimated by current accumulation. Thus, an error due to the current accumulation is not accumulated in an SOC intermediate region, and an SOC can be estimated with high accuracy.

Furthermore, the SOC after self-discharging caused by being left for a long period of time, etc. also can be estimated easily, and it is not required to initialize an SOC by performing complete discharging and complete charging periodically.

It is preferable that the first and second methods for estimating a remaining capacity of a secondary battery further include the steps of measuring a temperature of a secondary battery, and calculating a charging efficiency during charging based on the measured temperature, current, and estimated remaining capacity.

According to the above method, the temperature change, current change, and remaining capacity estimated value of a battery are fed back, whereby the calculation accuracy of an accumulated capacity can be enhanced.

In the first and second methods for estimating a remaining capacity of a secondary battery, it is preferable that the step of determining a correction amount includes the steps of previously obtaining characteristics of an electromotive force with respect to a remaining capacity, and calculating an estimated electromotive force from an estimated remaining capacity based on a look-up table or a formula storing the characteristics; and determining a correction amount based on a difference value between the electromotive force obtained in the step of calculating an electromotive force and the estimated electromotive force.

According to the above method, the remaining capacity estimated value is fed back as an estimated electromotive force, and the difference value between the calculated electromotive force and the estimated electromotive force is controlled to be zero, whereby the calculation accuracy of an accumulated capacity can be enhanced further.

Furthermore, in the first and second methods for estimating a remaining capacity of a secondary battery, it is preferable that the step of calculating an electromotive force includes the step of obtaining a no-load voltage that is a voltage intercept corresponding to a current value 0 in an approximate line obtained by statistical processing using least squares with respect to a plurality of data sets, and calculating a no-load voltage as an electromotive force.

According to the above method, the current accumulation coefficient can be corrected in accordance with an electromotive force with a simple configuration.

Alternatively, in the first and second methods for estimating a remaining capacity of a secondary battery, it is preferable that the step of calculating an electromotive force includes the steps of: calculating a variation of an accumulated capacity during a past predetermined period from a measured current; calculating a polarization voltage based on the variation of the accumulated capacity; calculating a no-load voltage that is a voltage intercept corresponding to a current value 0 in an approximate line obtained by statistical processing using least squares with respect to a plurality of data sets; and subtracting the polarization voltage from the no-load voltage to calculate an electromotive force.

According to the above method, the polarization voltage is calculated based on the variation of an accumulated capacity. Therefore, the calculation accuracy of a polarization voltage is satisfactory, and the calculation accuracy of a battery electromotive force (equilibrium potential) obtained by subtracting a polarization voltage from a no-load voltage is satisfactory. This makes it possible to estimate an SOC with high accuracy.

In the first and second methods for estimating a remaining capacity of a secondary battery, it is preferable that the step of calculating an electromotive force includes the step of subjecting the variation of an accumulated capacity to time delay processing.

According to the above method, the polarization voltage having a delay time with respect to the variation of an accumulated capacity can be calculated so as to follow the variation of an accumulated capacity in real time.

Furthermore, in the first and second methods for estimating a remaining capacity of a secondary battery, it is preferable that averaging processing by filtering as well as time delay processing are performed with respect to the variation of an accumulated capacity.

According to the above method, a fluctuation component of an accumulated capacity that is not necessary for calculating a polarization voltage can be reduced.

Furthermore, in the first and second methods for estimating a remaining capacity of a secondary battery, it is preferable that the step of calculating an electromotive force includes the step of subjecting a polarization voltage to time delay processing.

According to the above method, the timing between the no-load voltage and the polarization voltage can be adjusted, and an appropriate electromotive force can be calculated.

In this case, it is preferable that averaging processing by filtering as well as time delay processing are performed with respect to a polarization voltage.

According to the above method, a fluctuation component of a polarization voltage that is not necessary for calculating an electromotive force can be reduced.

It is preferable that the first and second methods for estimating a remaining capacity of a secondary battery further include the step of selecting a plurality of obtained data sets based on a predetermined selection condition, wherein a plurality of data sets are selected in the case where as a predetermined selection condition, a value of a current is in a predetermined range on a charging side and a discharging side, there are a predetermined number or more of data sets on the charging side and the discharging side, and a variation of an accumulated capacity while a plurality of data sets are being obtained is in a predetermined range.

According to the above method, a plurality of data sets can be obtained uniformly on a charging side and a discharging side without being influenced by a variation of an accumulated capacity.

It is preferable that the first and second methods for estimating a remaining capacity of a secondary battery further include the step of determining whether or not a calculated no-load voltage is effective based on a predetermined determination condition, wherein a calculated no-load voltage is determined to be effective in the case where as a predetermined determination condition, a variance of a plurality of data sets with respect to an approximate line obtained by statistical processing using least squares is in a predetermined range, or a correlation coefficient between the approximate line and the plurality of data sets is a predetermined value or more.

According to the above method, the calculation accuracy of a no-load voltage can be enhanced.

In the first and second methods for estimating a remaining capacity of a secondary battery, a secondary battery is a nickel-metal hydride secondary battery.

In order to achieve the above-mentioned object, a first battery pack system according to the present invention includes a computer system for performing the second method for estimating a remaining capacity of a secondary battery and a battery pack.

In order to achieve the above-mentioned object, a first motor-driven vehicle according to the present invention has a first battery pack system mounted thereon.

According to the above configuration, in the case where, as a microcomputer system, for example, a battery pack system with a battery ECU mounted thereon is mounted on, for example, an HEV, etc., an SOC can be controlled exactly based on the SOC estimated with high accuracy. More specifically, in the case where the SOC estimated by computation (SOC estimated value) is determined to be higher than a true SOC (SOC true value), the charging efficiency is reduced by a correction amount of the current accumulation coefficient. As a result, the SOC estimated value is decreased at subsequent accumulation, compared with the previous accumulation, so that the SOC estimated value is approximated to the SOC true value. On the other hand, in the case where the SOC estimated value is determined to be lower than the SOC true value, the charging efficiency is added by a correction amount of the current accumulation coefficient. As a result, the SOC estimated value is increased at subsequent accumulation, compared with the previous accumulation, so that the SOC estimated value also is approximated to the SOC true value. Thus, by continuing this control, the SOC estimated value and the SOC true value are managed so as to be always matched with each other, and the deviation of the SOC estimated value with respect to the SOC true value is decreased. This can remarkably enhance the accuracy of energy management of an entire system.

In order to achieve the above-mentioned object, a first apparatus for estimating a remaining capacity of a secondary battery according to the present invention includes: a current measuring section for measuring a current flowing through a secondary battery as current data; a voltage measuring section for measuring a terminal voltage of the secondary battery corresponding to the current as voltage data; an electromotive force calculation section for calculating an electromotive force of the secondary battery based on a plurality of data sets of the current data from the current measuring section and the voltage data from the voltage measuring section; a current accumulation coefficient correction section for determining a correction amount with respect to a current accumulation coefficient in accordance with the electromotive force from the electromotive force calculation section; an adder for outputting the current accumulation coefficient from the correction amount from the current accumulation coefficient correction section and a charging efficiency; and a remaining capacity estimation section for multiplying the current accumulation coefficient from the adder by the current data, and estimating a remaining capacity of the secondary battery by current accumulation.

In order to achieve the above-mentioned object, a second apparatus for estimating a remaining capacity of a secondary battery according to the present invention includes: a current measuring section for measuring a current flowing through a battery pack having a combination of a plurality of cells that are secondary batteries and used in an intermediately charged state, as current data; a voltage measuring section for measuring a terminal voltage of the secondary battery corresponding to the current as voltage data; an electromotive force calculation section for calculating an electromotive force of the secondary battery, based on the plurality of data sets of the current data from the current measuring section and the voltage data from the voltage measuring section; a current accumulation coefficient correction section for determining a correction amount with respect to a current accumulation coefficient, in accordance with the electromotive force from the electromotive force calculation section; an adder for outputting the current accumulation coefficient from the correction amount from the current accumulation coefficient correction section and a charging efficiency; and a remaining capacity estimation section for multiplying the current accumulation coefficient from the adder by the current data, and estimating the remaining capacity of a secondary battery by current accumulation.

According to the above configuration, the current accumulation coefficient is corrected in accordance with a battery electromotive force and an SOC is estimated by current accumulation. Thus, an error due to the current accumulation is not accumulated in an SOC intermediate region, and an SOC can be estimated with high accuracy.

Furthermore, the SOC after self-discharging caused by being left for a long period of time, etc. also can be estimated easily, and it is not required to initialize an SOC by performing complete discharging and complete charging periodically.

It is preferable that the first and second apparatuses for estimating a remaining capacity of a secondary battery further includes a temperature measuring section for measuring a temperature of a secondary battery as temperature data, and a charging efficiency calculation section for calculating a charging efficiency during charging based on the temperature from the temperature measuring section, the current from the current measuring section, and the remaining capacity estimated value from the remaining capacity estimation section.

According to the above configuration, the temperature change and remaining capacity estimated value of a battery are fed back to a charging efficiency, whereby the calculation accuracy of an accumulated capacity can be enhanced.

Furthermore, it is preferable that the first and second apparatuses for estimating a remaining capacity of a secondary battery further includes an estimated electromotive force calculation section for calculating an estimated electromotive force from a remaining capacity estimated value based on a previously obtained look-up table or a formula storing the characteristics of an electromotive force with respect to a remaining capacity, and the current accumulation coefficient correction section determines a correction amount based on a difference value between the electromotive force from the electromotive force calculation section and the estimated electromotive force.

According to the above configuration, the remaining capacity estimated value is fed back as an estimated electromotive force, and the difference value between the calculated electromotive force and the estimated electromotive force is controlled to be zero, whereby the calculation accuracy of an accumulated capacity can be enhanced further.

In the first and second apparatuses for estimating a remaining capacity of a secondary battery, it is preferable that the electromotive force calculation section obtains a no-load voltage that is a voltage intercept corresponding to a current value 0 in an approximate line obtained by statistical processing using least squares with respect to a plurality of data sets, and calculating a no-load voltage as an electromotive force.

According to the above configuration, the current accumulation coefficient can be corrected in accordance with an electromotive force with a simple configuration.

In the first and second apparatuses for estimating a remaining capacity of a secondary battery, it is preferable that the electromotive force calculation section includes: a varied capacity calculation section for calculating a variation of an accumulated capacity during a past predetermined period from current data; a polarization voltage calculation section for calculating a polarization voltage based on the variation of the accumulated capacity from the varied capacity calculation section; a no-load voltage calculation section for calculating a no-load voltage that is a voltage intercept corresponding to a current value 0 in an approximate line obtained by statistical processing using least squares with respect to a plurality of data sets; and a subtractor for subtracting the polarization voltage from the no-load voltage to output an electromotive force.

According to the above configuration, the polarization voltage is calculated based on the variation of an accumulated capacity. Therefore, the calculation accuracy of a polarization voltage is satisfactory, and the calculation accuracy of a battery electromotive force (equilibrium potential) obtained by subtracting a polarization voltage from a no-load voltage is satisfactory. This makes it possible to estimate an SOC with high accuracy.

It is preferable that the first or second apparatuses for estimating a remaining capacity of a secondary battery further includes a first computation section for subjecting the variation of an accumulated capacity from the varied capacity calculation section to time delay processing.

According to the above configuration, the polarization voltage having a delay time with respect to the variation of an accumulated capacity can be calculated so as to follow the variation of an accumulated capacity in real time.

Furthermore, in the first or second apparatuses for estimating a remaining capacity of a secondary battery, it is preferable that the first computation section subjects the variation of an accumulated capacity to averaging processing by filtering, as well as time delay processing According to the above configuration, a fluctuation component of an accumulated capacity that is not necessary for calculating a polarization voltage can be reduced.

It is preferable that the first or second apparatus for estimating a remaining capacity of a secondary battery includes a second computation section for subjecting a polarization voltage to time delay processing.

According to the above configuration, the timing between the no-load voltage and the polarization voltage can be adjusted, and an appropriate electromotive force can be calculated.

In this case, it is preferable that the second computation section performs averaging processing by filtering, as well as time delay processing.

According to the above configuration, a fluctuation component of a polarization voltage that is not necessary for calculating an electromotive force can be reduced.

Furthermore, it is preferable that the first or second apparatus for estimating a remaining capacity of a secondary battery further includes a data set selection section for selecting a plurality of data sets based on a predetermined selection condition and outputting them to the no-load voltage calculation section, wherein the data set selection section selects a plurality of data sets in the case where as a predetermined selection condition, a value of a current is in a predetermined range on a charging side and a discharging side, there are a predetermined number or more of data sets on the charging side and the discharging side, and a variation of an accumulated capacity while a plurality of data sets are being obtained is in a predetermined range.

According to the above configuration, a plurality of data sets can be obtained uniformly on a charging side and a discharging side without being influenced by a variation of an accumulated capacity.

Furthermore, it is preferable that the first or second apparatus for estimating a remaining capacity of a secondary battery further includes a no-load voltage determination section for determining whether or not a no-load voltage calculated in the no-load voltage calculation section is effective based on a predetermined determination condition, wherein the no-load voltage determination section determines the calculated no-load voltage to be effective in the case where as a predetermined determination condition, a variance of a plurality of data sets with respect to an approximate line obtained by statistical processing using least squares is in a predetermined range, or a correlation coefficient between the approximate line and the plurality of data sets is a predetermined value or more.

According to the above configuration, the calculation accuracy of a no-load voltage can be enhanced.

In the first and second apparatuses for estimating a remaining capacity of a secondary battery, a secondary battery is a nickel-metal hydride secondary battery.

In order to achieve the above-mentioned object, the second battery pack system according to the present invention includes the second apparatus for estimating a remaining capacity of a secondary battery, and a battery pack. In this case, it is preferable that the second apparatus for estimating a remaining capacity of a secondary battery is configured as a computer system.

In order to achieve the above-mentioned object, a second motor-driven vehicle according to the present invention has the second battery pack system mounted thereon.

According to the above configuration, in the case where, as a microcomputer system, for example, a battery pack system with a battery ECU mounted thereon is mounted on, for example, an HEV, etc., an SOC can be controlled exactly based on the SOC estimated with high accuracy. More specifically, in the case where the SOC estimated by computation (SOC estimated value) is determined to be higher than a true SOC (SOC true value), the charging efficiency is reduced by a correction amount of the current accumulation coefficient. As a result, the SOC estimated value is decreased at subsequent accumulation, compared with the previous accumulation, so that the SOC estimated value is approximated to the SOC true value. On the other hand, in the case where the SOC estimated value is determined to be lower than the SOC true value, the charging efficiency is added by a correction amount of the current accumulation coefficient. As a result, the SOC estimated value is increased at subsequent accumulation, compared with the previous accumulation, so that the SOC estimated value also is approximated to the SOC true value. Thus, by continuing this control, the SOC estimated value and the SOC true value are managed so as to be always matched with each other, and the deviation of the SOC estimated value with respect to the SOC true value is decreased. This can remarkably enhance the accuracy of energy management of an entire system.

BEST MODE FOR CARRYING OUT THE INVENTION

Hereinafter, the present invention will be described by way of preferred embodiments with reference to the drawings.

Embodiment 1

Figure 1:
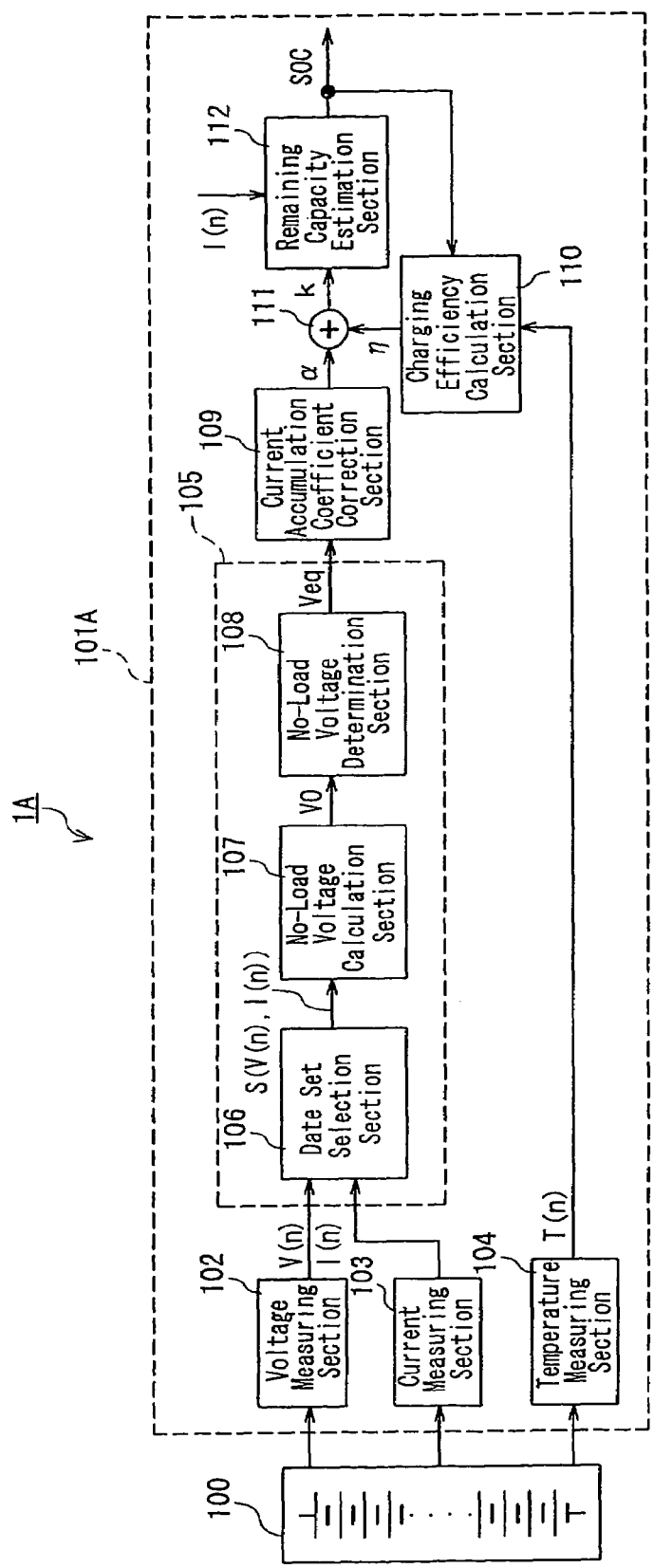
FIG. 1 is a block diagram showing an exemplary configuration of a battery pack system according to Embodiment 1 of the present invention.

FIG. 1 is a block diagram showing an exemplary configuration of a battery pack system 1A according to Embodiment 1 of the present invention. In FIG. 1, the battery pack system 1A is composed of a battery pack 100 and a battery ECU 101A including an apparatus for estimating a remaining capacity according to the present invention as a part of a microcomputer system.

The battery pack 100 has a configuration in which a plurality of battery modules (cells), each having a plurality of cells (e.g., nickel-metal hydride batteries) electrically connected in series, are electrically connected in series, so as to obtain a predetermined output, generally when mounted on an HEV, etc.

In the battery ECU 101A, reference numeral 102 denotes a voltage measuring section for measuring a terminal voltage of the secondary battery 100 detected by a voltage sensor (not shown) at a predetermined sampling period as voltage data V(n), 103 denotes a current measuring section for measuring a charging/discharging current of the secondary battery 100 detected by a current sensor (not shown) at a predetermined sampling period as current data I(n) (the sign of which represents a charging direction or a discharging direction), and 104 denotes a temperature measuring section for measuring a temperature of the secondary battery 100 detected by a temperature sensor (not shown) as temperature data T(n).

Reference numeral 105 denotes an electromotive force calculation section, which is composed of a data set selection section 106, a no-load voltage calculation section 107, and a no-load voltage determination section 108.

The voltage data V(n) from the voltage measuring section 102 and the current data I(n) from the current measuring section 103 are input to the data set selection section 106 as data sets. In the data set selection section 106, in the case where as a selection condition, the values of the current data I(n) in a charging direction (−) and a discharging direction (+) are in a predetermined range (e.g., ±50 A), there are a predetermined number or more (e.g., each 10 among 60 samples) of current data I(n) in the charging direction and the discharging direction, and the variation ΔQ of the accumulated capacity while data sets are being obtained is in a predetermined range (e.g., 0.3 Ah), the data sets of the voltage data V(n) and the current data I(n) are determined to be effective, and they are selected and output as effective data sets S(V(n), I(n)).

Figure 2:
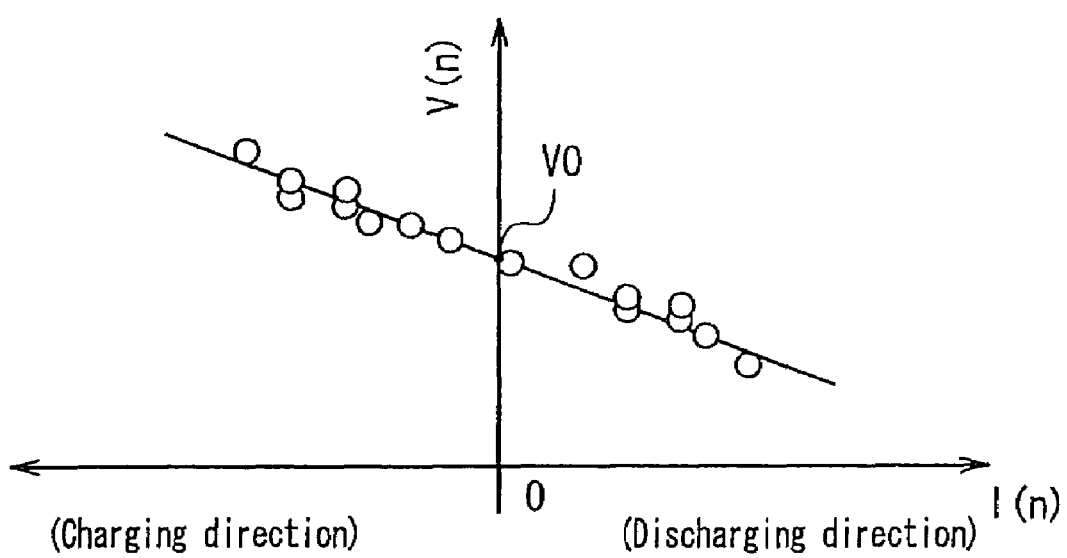
FIG. 2 is a diagram showing data sets of voltage data V(n) and current data I(n) and an approximate line for obtaining a no-load voltage V0 from the data sets by statistical processing.

The effective data sets S(V(n), I(n)) from the data set selection section 106 are input to the no-load voltage calculation section 107. In the no-load voltage calculation section 107, as shown in FIG. 2, a primary voltage-current line (approximate line) is obtained from the effective data sets S(V(n), I(n)) by statistical processing using least squares, and a voltage value (voltage (V) intercept) corresponding to 0 current is calculated as a no-load voltage V0.

The no-load voltage V0 from the no-load voltage calculation section 107 is input to the no-load voltage determination section 108. In the no-load voltage determination section 108, in the case where as a determination condition, a variance of the data sets S(V(n), I(n)) with respect to the approximate line is obtained and this variance is in a predetermined range, or a correlation coefficient between the approximate line and the data sets S(V(n), I(n)) is obtained and this correlation coefficient is a predetermined value or greater, the calculated no-load voltage V0 is determined to be effective and is output as an electromotive force Veq of a battery.

The electromotive force Veq from the electromotive force calculation section 105 is input to a current accumulation coefficient correction section 109. In the current accumulation coefficient correction section 109, a correction amount α with respect to a current accumulation coefficient k is determined in accordance with the electromotive force Veq. The correction amount α with respect to the electromotive force Veq is represented by a primary expression, which is determined considering the convergence of a system. The correction amount α obtained in the current accumulation coefficient correction section 109 is added to or subtracted from a charging efficiency η output from a charging efficiency calculation section 110 by an adder 111 to obtain the current accumulation coefficient k The current accumulation coefficient k from the adder 111 is input to a remaining capacity estimation section 112. In the remaining capacity estimation section, the current data I(n) from the current measuring section 103 is multiplied by the current accumulation coefficient k, and a remaining capacity SOC is estimated by current accumulation during a predetermined period of time.

Furthermore, the SOC estimated value is input to the charging efficiency calculation section 110. In the charging efficiency calculation section 110, the charging efficiency η is calculated from previously stored characteristic curves of the charging efficiency η with respect to the SOC estimated value with a temperature being a parameter, based on temperature data T(n), which is measured in the temperature measuring section 104. In the case where the battery pack 100 is in a discharged state, the charging efficiency η is fixed to 1. In the case where the battery pack 100 is in a charged state, the charging efficiency η calculated by the charging efficiency calculation section 110 is used.

Next, the processing procedure of estimating a remaining capacity in a battery pack system as configured above will be described with reference to FIG. 3.

Figure 3:
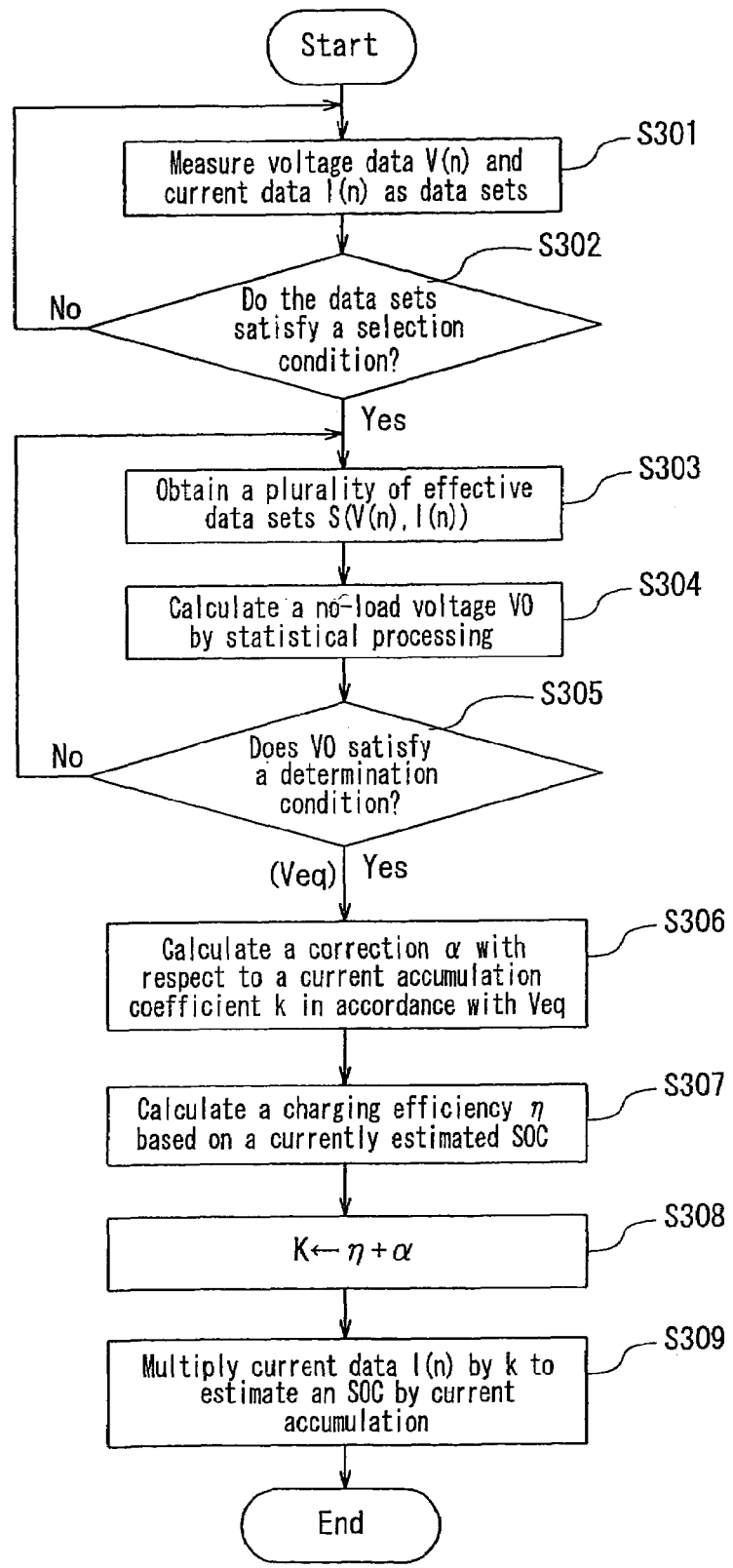
FIG. 3 is a flow chart showing a processing procedure in a method for estimating a remaining capacity of a secondary battery according to Embodiment 1 of the present invention.

FIG. 3 is a flow chart showing the processing procedure in the method for estimating a remaining capacity of a secondary battery according to Embodiment 1 of the present invention. In FIG. 3, voltage data V(n) and current data I(n) are measured as data sets (S301). Then, in order to examine whether or not the data sets of the voltage data V(n) and the current data I(n) measured in Step S301 are effective, it is determined whether or not these data sets satisfy the selection condition as described above (S302). In the case where the data sets do not satisfy the selection condition in the determination in Step S302 (No), the process returns to Step S301, and the data sets of the voltage data V(n) and the current data I(n) are measured again. On the other hand, in the case where the data sets satisfy the selection condition in the determination in Step S302 (Yes), the process proceeds to Step S303, and a plurality of (e.g., each 10 in the charging and discharging directions among 60 samples) effective data sets S(V(n), I(n)) are obtained (S303).

Next, a primary approximate line (V-I line) is obtained from the effective data sets S(V(n), I(n)), by statistical processing using least squares. A V intercept of the approximate line is calculated as a no-load voltage V0 (S304). Then, in order to examine whether or not the no-load voltage V0 calculated in Step S304 is effective, it is determined whether or not the no-load voltage V0 satisfies the above-mentioned determination condition (S305). In the case where the no-load voltage V0 does not satisfy the determination condition in the determination in Step S305 (No), the process returns to Step S303. Then, another plurality of (e.g., different each 10 among 60 samples) effective data sets S(V(n), I(n)) are obtained, and Steps S304 and S305 are repeated. On the other hand, in the case where the calculated no-load voltage V0 satisfies the determination condition in the determination in Step S305 (Yes), the calculated no-load voltage V0 is set to be an electromotive force Veq.

Then, a correction amount α with respect to a current accumulation coefficient k is calculated in accordance with the electromotive force Veq (S306). Furthermore, a charging efficiency η is calculated from a remaining capacity SOC (SOC estimated value) that is currently estimated, based on measured temperature data T(n) (S307). Then, the correction amount α obtained in Step S306 is added to the charging efficiency η obtained in Step S307 to calculate the current accumulation efficient k (S308). Finally, the current data I(n) is multiplied by the current accumulation coefficient k, and a remaining capacity SOC is estimated by current accumulation during a predetermined period (S309).

As described above, according to the present embodiment, the current accumulation coefficient k is corrected in accordance with the battery electromotive force Veq, and an SOC is estimated by current accumulation, whereby an error due to current accumulation is not accumulated in an SOC intermediate region, and an SOC can be estimated with high accuracy.

Embodiment 2

Figure 4:
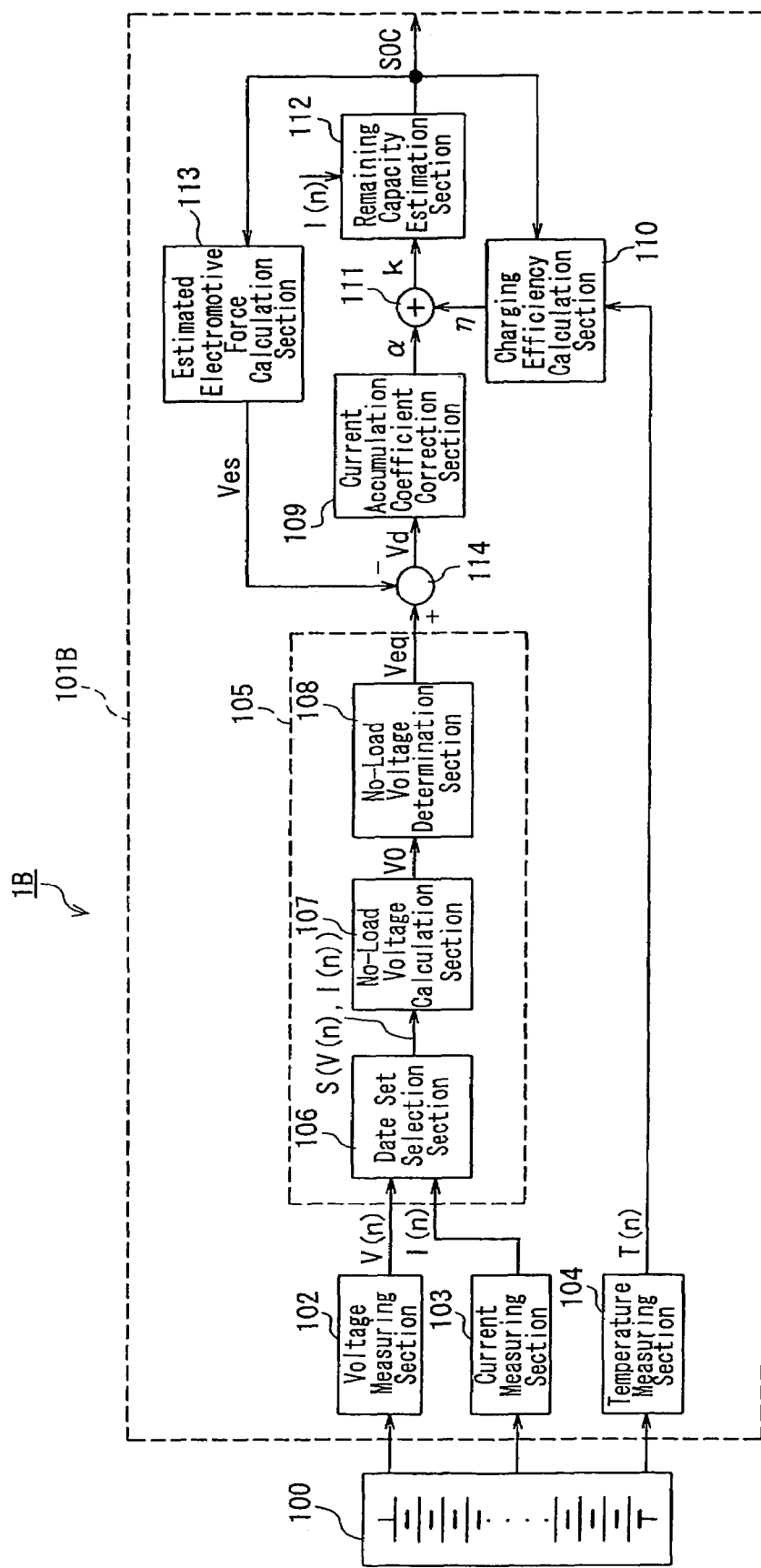
FIG. 4 is a block diagram showing an exemplary configuration of a battery pack system according to Embodiment 2 of the present invention.

FIG. 4 is a block diagram showing an exemplary configuration of a battery pack system according to Embodiment 2 of the present invention. In FIG. 4, the same components as those shown in FIG. 1 representing the configuration of Embodiment 1 are denoted with the same reference numerals as those therein, and the description thereof will be omitted here.

In the present embodiment, an estimated electromotive force calculation section 113 and a subtractor 114 are added to Embodiment 1 to configure a battery ECU 101B.

The estimated electromotive force calculation section 113 obtains an estimated electromotive force Ves from a currently estimated SOC. The subtractor 114 subtracts the estimated electromotive force Ves, which is calculated in the estimated electromotive force calculation section 113, from the electromotive force Veq, which is calculated in the electromotive force calculation section 105, and outputs an electromotive force deviation Vd to the current accumulation coefficient correction section 109.

Next, the processing procedure of estimating a remaining capacity in a battery pack system as configured above will be described with reference to FIG. 5.

Figure 5:
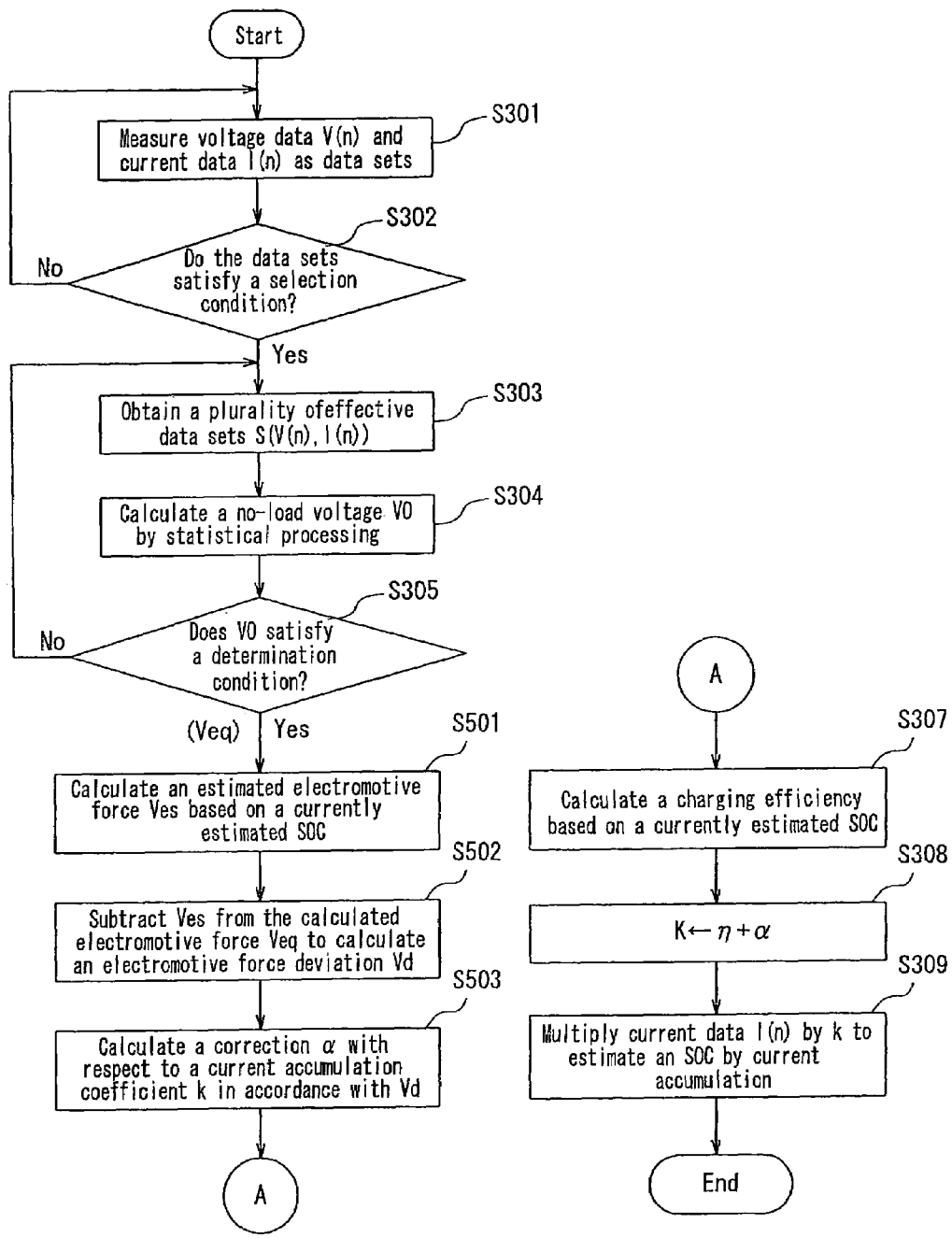
FIG. 5 is a flow chart showing a processing procedure in a method for estimating a remaining capacity of a secondary battery according to Embodiment 2 of the present invention.

FIG. 5 is a flow chart showing the processing procedure in the method for estimating a remaining capacity of a secondary battery according to Embodiment 2 of the present invention. In FIG. 5, the same processing steps as those in FIG. 3 representing the processing procedure of Embodiment 1 are denoted with the same reference numerals, and the description thereof will be omitted here.

In FIG. 5, the steps up to the determination step of a no-load voltage V0 (S305) are the same as those in Embodiment 1, so that the description thereof will be omitted here. In the case where the calculated no-load voltage V0 satisfies the determination condition in the determination in Step S305 (Yes), an estimated electromotive force Ves is calculated from the SOC estimated value, based on a previously obtained look-up table or formula storing characteristics of an electromotive force with respect to a remaining capacity (S501). Then, the estimated electromotive force Ves is subtracted from the electromotive force Veq determined in Step S305 to calculate an electromotive force deviation Vd (S502). Then, the correction amount α with respect to the current accumulation coefficient k is calculated in accordance with the electromotive force deviation Vd (S503).

The subsequent steps are the same as those in Embodiment 1, so that the description thereof will be omitted here.

As described above, according to the present embodiment, an SOC estimated value is fed back as the estimated electromotive force Ves, and a difference value between the calculated electromotive force Veq and the estimated electromotive force Ves is controlled to be zero, whereby the calculation accuracy of the accumulated capacity can be further enhanced.

Embodiment 3

Figure 6:
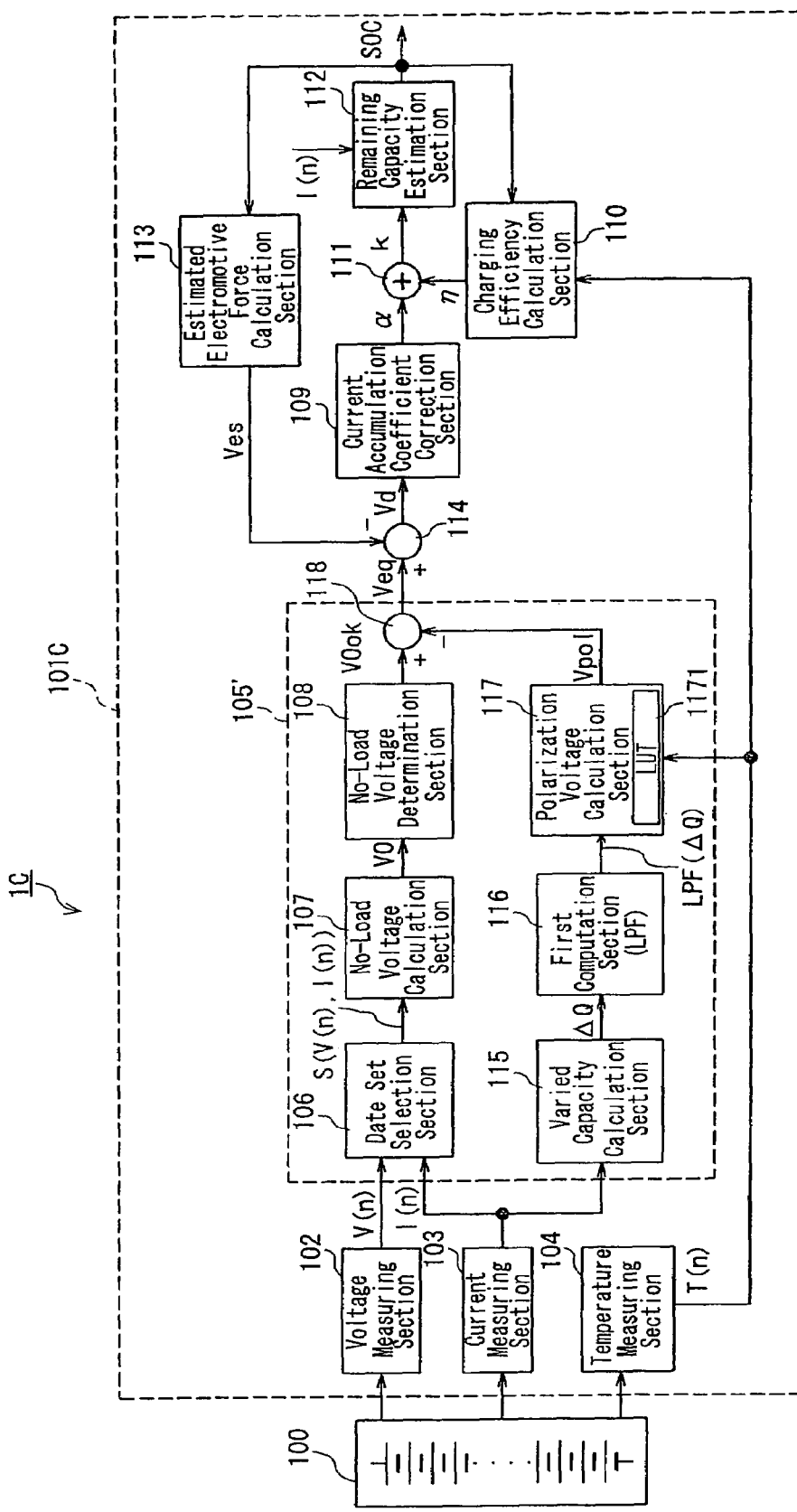
FIG. 6 is a block diagram showing an exemplary configuration of a battery pack system according to Embodiment 3 of the present invention.

FIG. 6 is a block diagram showing an exemplary configuration of a battery pack system 1C according to Embodiment 3 of the present invention. In FIG. 6, the same components as those shown in FIG. 4 representing the configuration of Embodiment 2 are denoted with the same reference numerals as those therein, and the description thereof will be omitted here.

In the present embodiment, a varied capacity calculation section 115, a first computation section 116, a polarization voltage calculation section 117, and a subtractor 118 are added to the electromotive force calculation section 105 of Embodiment 2 to obtain an electromotive force calculation section 105', whereby a battery ECU 101C is configured.

The varied capacity calculation section 115 obtains a variation ΔQ of the accumulated capacity during a past predetermined period (e.g., one minute) from the current data I(n).

Figure 7:
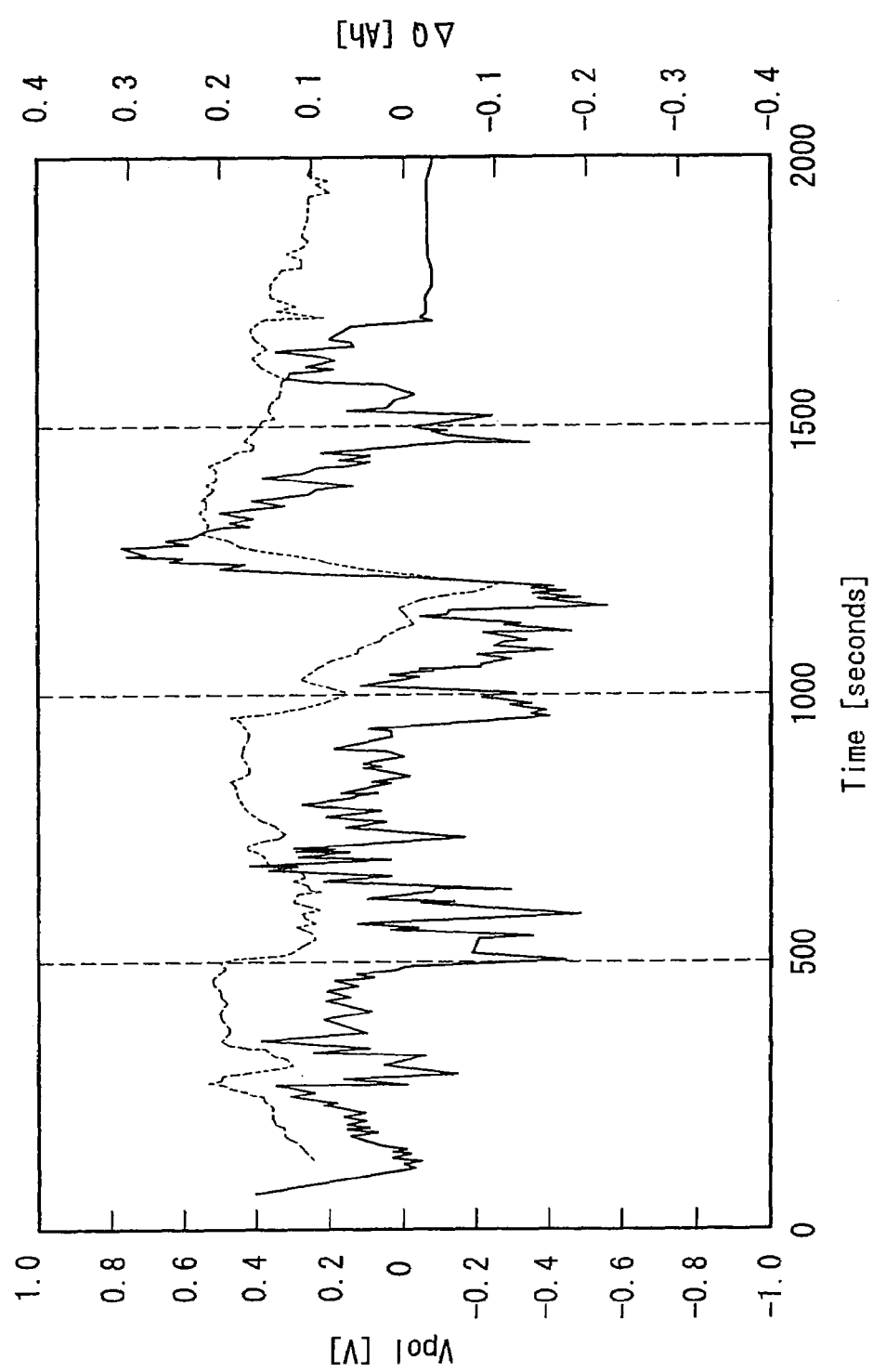
FIG. 7 is a diagram showing an example of a variation $\Delta Q$ of an accumulated capacity and a change in a polarization voltage Vpol with the passage of time in Embodiment 3.

The first computation section 116 functions as a low-pass filter (LPF). The first computation section 116 performs time delay processing for adjusting the timing between the variation ΔQ of the accumulated capacity from the varied capacity calculation section 115 and a polarization voltage Vpol obtained in the subsequent polarization voltage calculation section 117, and averaging processing for removing a fluctuation component corresponding to an unnecessary high-frequency component in the variation ΔQ of the accumulated capacity, and outputs the results as LPF (ΔQ). Herein, FIG. 7 shows, as an example, the variation ΔQ of the accumulated capacity during the past one minute as a solid line, and the polarization voltage Vpol as a broken line. It is understood from FIG. 7 that the polarization voltage Vpol is changed after tens of seconds from the variation ΔQ of the accumulated capacity during the past one minute. Corresponding to this time delay, a time constant τ of the LPF (in the present embodiment, the LPF is composed of a primary delay element) constituting the first computation section 116 is determined. The time constant τ is determined so that a primary delay element is computed with respect to ΔQ, and a correlation coefficient between the LPF (ΔQ) and the polarization voltage Vpol is maximized.

In the polarization voltage calculation section 117, the polarization voltage Vpol is calculated based on the temperature data T(n) measured in the temperature measuring section 104, from a characteristic curve or a formula of the polarization voltage Vpol with respect to the LPF (ΔQ) with a temperature being a parameter, previously stored in a look-up table (LUT) 1171.

The subtractor 118 substrates the polarization voltage Vpol from the effective electromotive force $V0_{OK}$ to output an electromotive force Veq.

Next, the processing procedure of estimating a remaining capacity in a battery pack system as configured above will be described with reference to FIG. 8.

Figure 8:
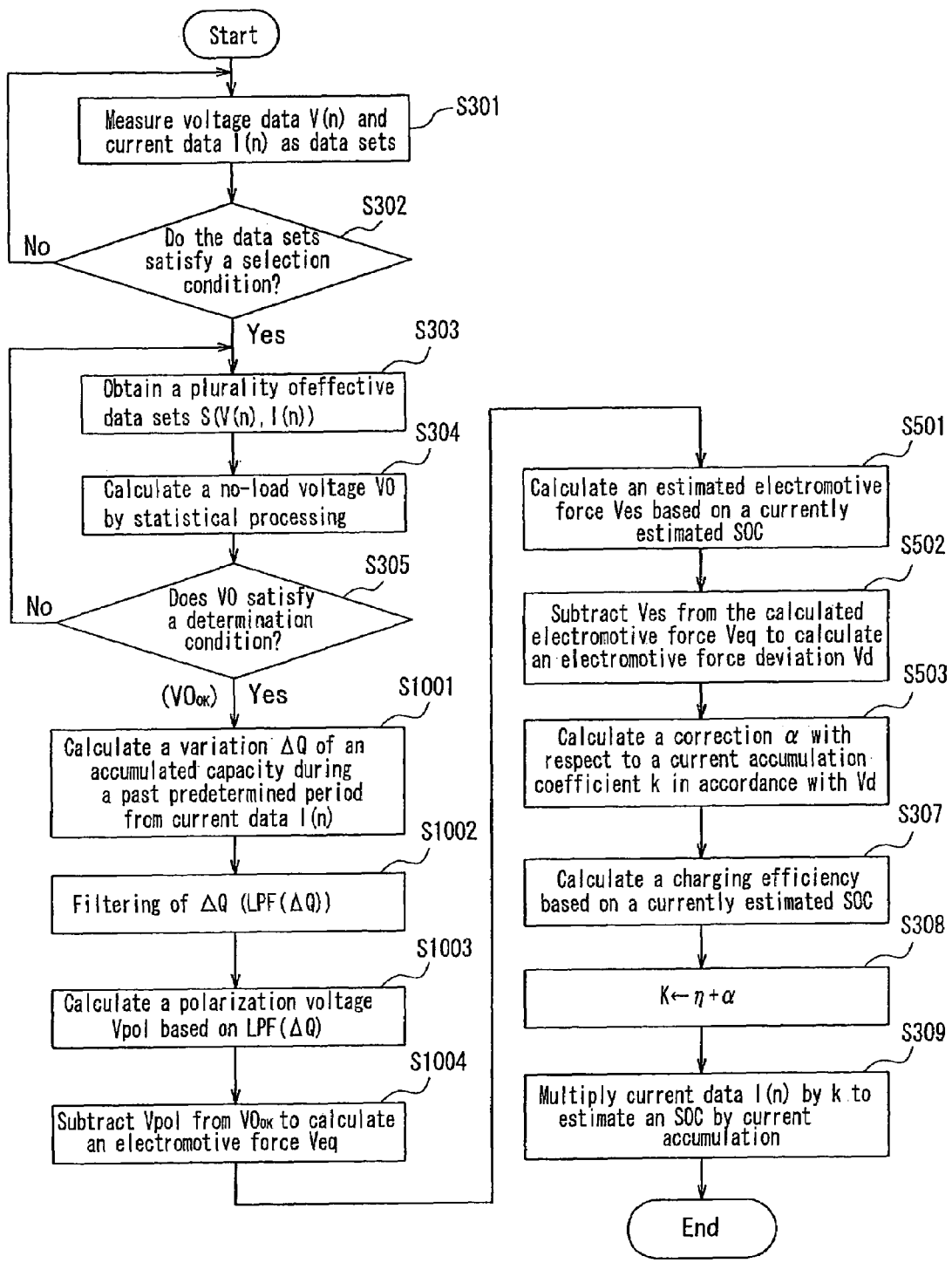
FIG. 8 is a flow chart showing a processing procedure in a method for estimating a remaining capacity of a secondary battery according to Embodiment 3 of the present invention.

FIG. 8 is a flow chart showing the processing procedure in the method for estimating a remaining capacity of a secondary battery according to Embodiment 3 of the present invention. In FIG. 8, the same processing steps as those in FIG. 5 representing the processing procedure of Embodiment 2 are denoted with the same reference numerals as those therein, and the description thereof will be omitted here.

In FIG. 8, the steps up to the determination step of a no-load voltage V0 (S305) are the same as those in Embodiment 1, so that the description thereof will be omitted here. In the present embodiment, a variation ΔQ of an accumulated capacity during a past predetermined period (e.g., one minute) is obtained from the current data I(n) measured in Step S301 (S1001). Then, the variation ΔQ of the accumulated capacity is subjected to filtering (time delay and averaging processing) to compute LPF (ΔQ) (S1002). Then, a polarization voltage Vpol is calculated from the computed LPF (ΔQ), based on a look-up table or formula which stores previous polarization voltage Vpol-LPF (ΔQ) characteristic data with the temperature data T(n) being a parameter (S1003).

Next, the polarization voltage Vpol calculated in Step S1003 is subtracted from the effective no-load voltage $V0_{OK}$ determined in Step S305 to calculate an electromotive force Veq (S1004).

The subsequent steps are the same as those in Embodiment 2, so that the description thereof will be omitted here.

Figure 9:
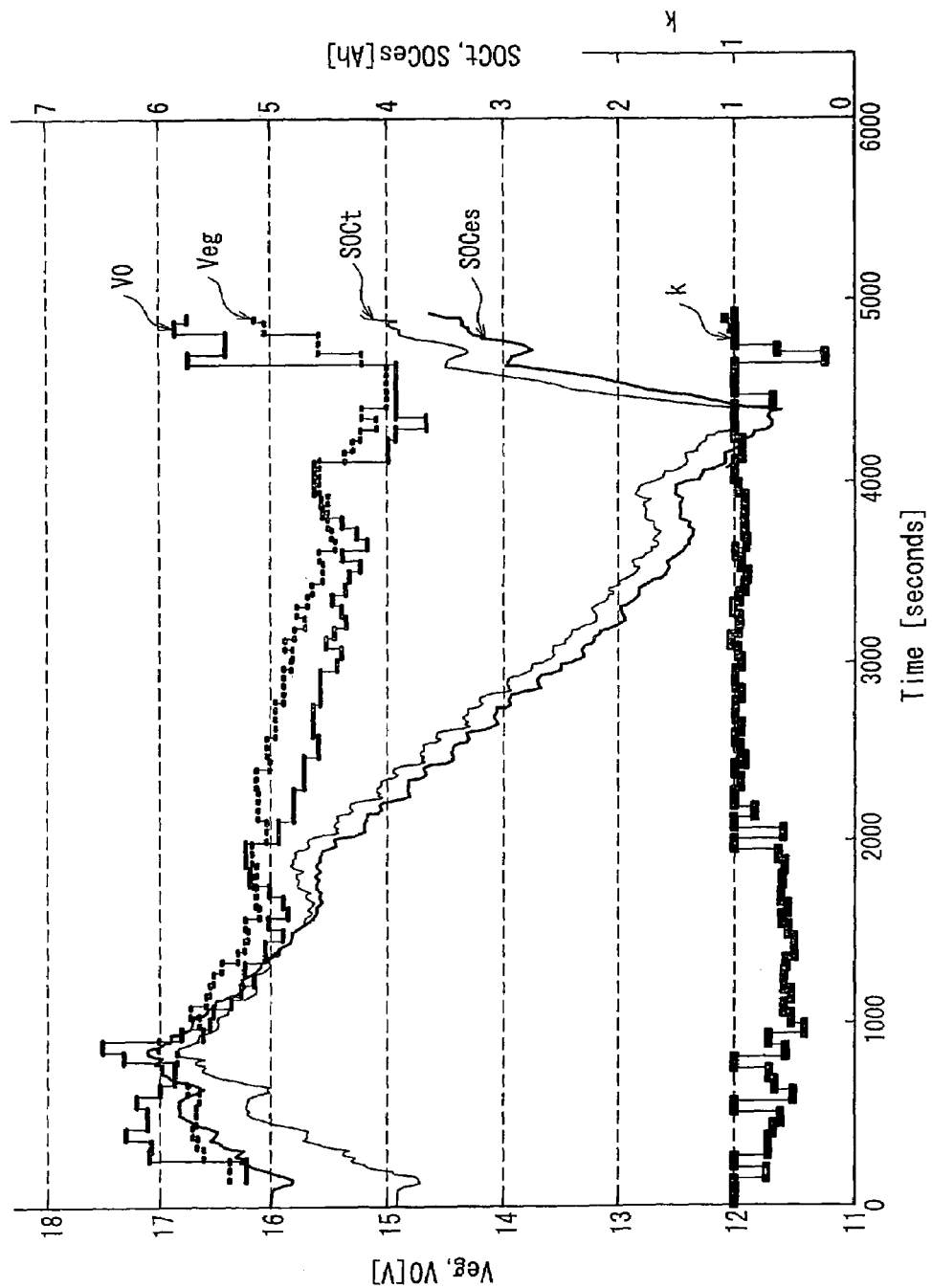
FIG. 9 is a diagram showing a change with the passage of time in a no-load voltage V0, an electromotive force Veq, a current accumulation coefficient k, an SOC true value (SOCt), and an SOC estimated value (SOCes) in Embodiment 3.

FIG. 9 is a diagram showing a change with the passage of time in a no-load voltage V0, an electromotive force Veq, a current accumulation coefficient k, an SOC true value (SOCt), and an SOC estimated value (SOCes). In FIG. 9, the polarization voltage Vpol is subtracted from the no-load voltage V0 to obtain an electromotive force Veq, and an SOC is estimated using the current accumulation coefficient k corrected in accordance with the electromotive force Veq, whereby it is understood that the SOC estimated value SOCes follows the SOC true value SOCt.

Figure 10:
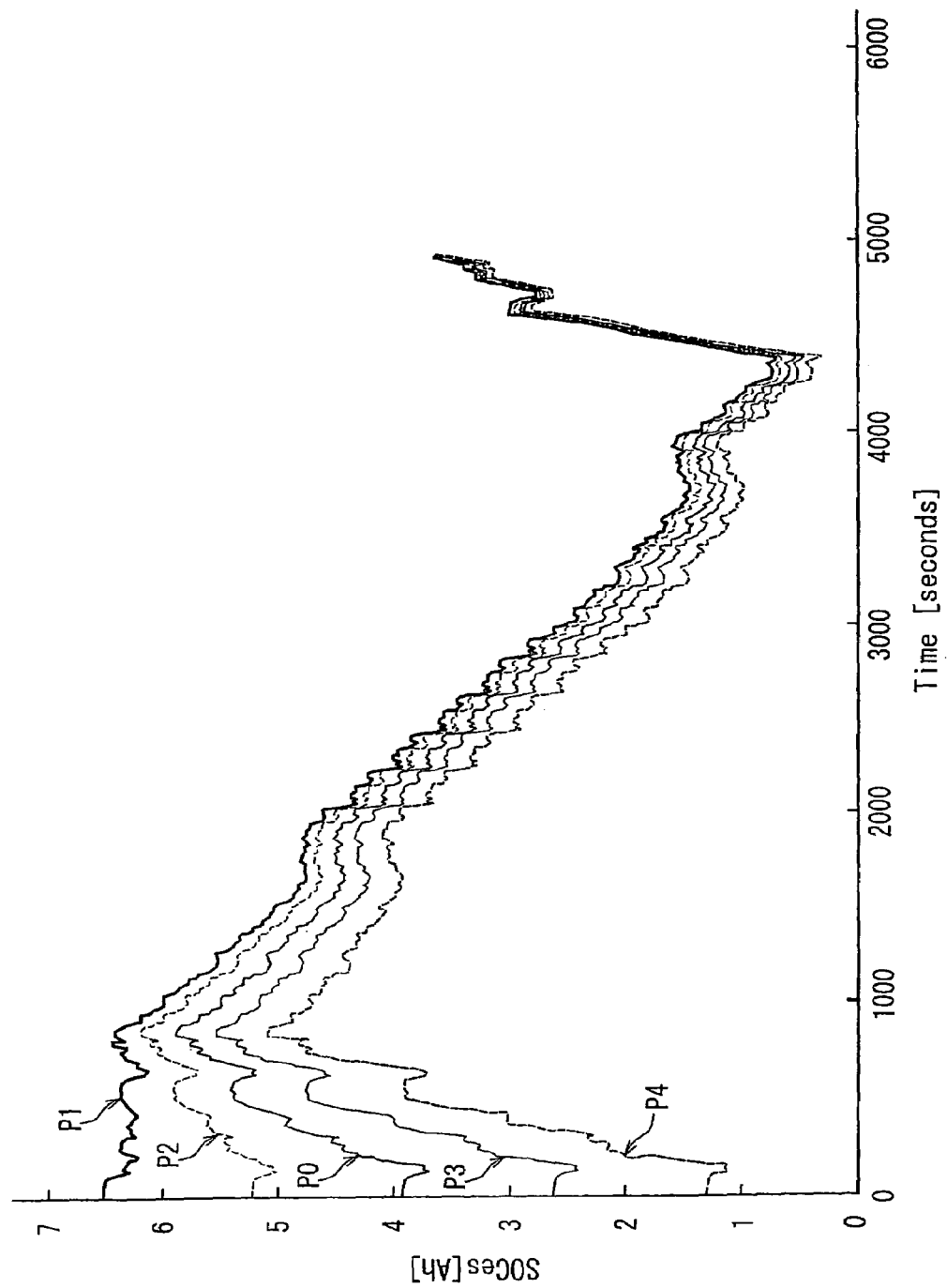
FIG. 10 shows the convergence of an SOC estimated value in the case where the initial value at a time of estimation of an SOC is changed in Embodiment 3.

FIG. 10 shows the convergence of an SOC estimated value in the case where an initial value at a time of estimation of an SOC is changed. FIG. 10 shows plotted data representing a change in an SOC estimated value with the passage of time: P0 in the case where an initial value is 3.9 Ah (SOC true value); P1 in the case where an initial value is 6.5 Ah, P2 in the case where an initial value is 5.2 Ah; P3 in the case where an initial value is 2.6 Ah; and P4 in the case where an initial value is 1.3 Ah. As is understood from FIG. 10, even if the initial value is ±2.6 Ah (error of about ±67%) with respect to the true value (3.9 Ah), the SOC estimated value is converged to ±0.2 Ah (error of about ±15%) with respect to the true value (1.3 Ah) after about one hour (3600 seconds).

As described above, according to the present embodiment, the polarization voltage Vpol is calculated based on the variation ΔQ of the accumulated capacity. Therefore, the calculation accuracy of the polarization voltage Vpol is satisfactory, and the calculation accuracy of the battery electromotive force Veq obtained by subtracting the polarization voltage Vpol from the no-load voltage V0 is satisfactory, whereby an SOC can be estimated with high accuracy.

Furthermore, the variation ΔQ of the accumulated capacity is subjected to filtering (time delay and averaging processing). Thus, the polarization voltage Vpol having a time delay with respect to the variation ΔQ of the accumulated capacity can be calculated so as to follow the variation ΔQ of the accumulated capacity in real time. Furthermore, a fluctuation component of the accumulated capacity that is not necessary for calculating the polarization voltage Vpol can be reduced.

Embodiment 4

Figure 11:
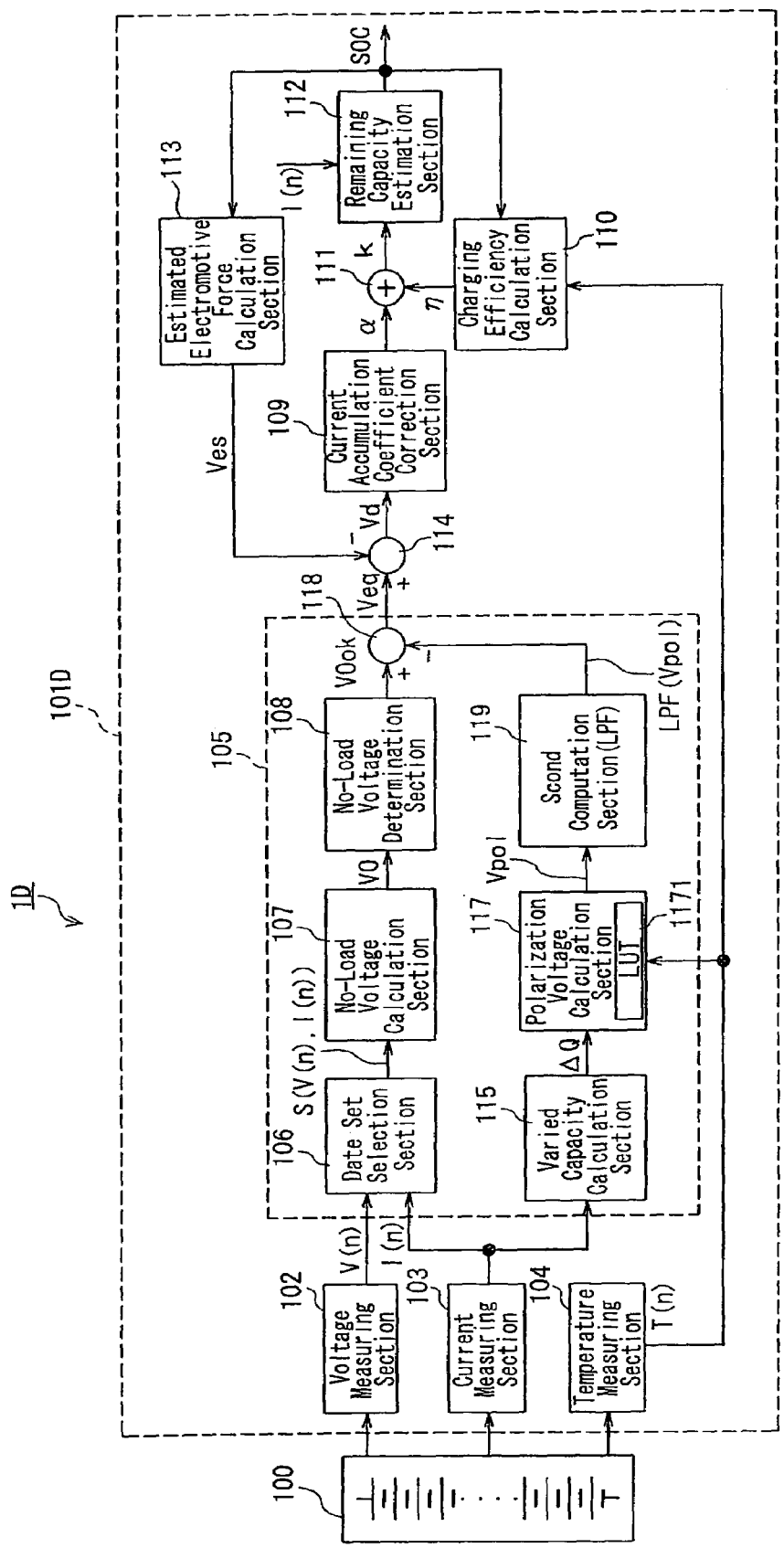
FIG. 11 is a block diagram showing an exemplary configuration of a battery pack system according to Embodiment 4 of the present invention.

FIG. 11 is a block diagram showing an exemplary configuration of a battery back system 1D according to Embodiment 4 of the present invention. In FIG. 11, the same components as those in FIG. 6 representing the configuration of Embodiment 3 are denoted with the same reference numerals as those therein, and the description thereof will be omitted here.

In the present embodiment, the first computation section 115 is omitted from the electromotive force calculation section 105' of Embodiment 3, and a second computation section 119 is provided instead to obtain an electromotive force calculation section 105", whereby a battery ECU 101D is configured.

The second computation section 119 functions as a low-pass filter (LPF). The second computation section 119 performs time delay processing for adjusting the timing between the polarization voltage Vpol from the polarization voltage calculation section 117 and the effective no-load voltage $V0_{OK}$ from the no-load voltage determination section 108, and averaging processing for removing a fluctuation component corresponding to an unnecessary high-frequency component in the polarization voltage Vpol, and outputs the results as LPF (Vpol).

Next, the processing procedure of estimating a remaining capacity in a battery pack system as configured above will be described with reference to FIG. 12.

Figure 12:
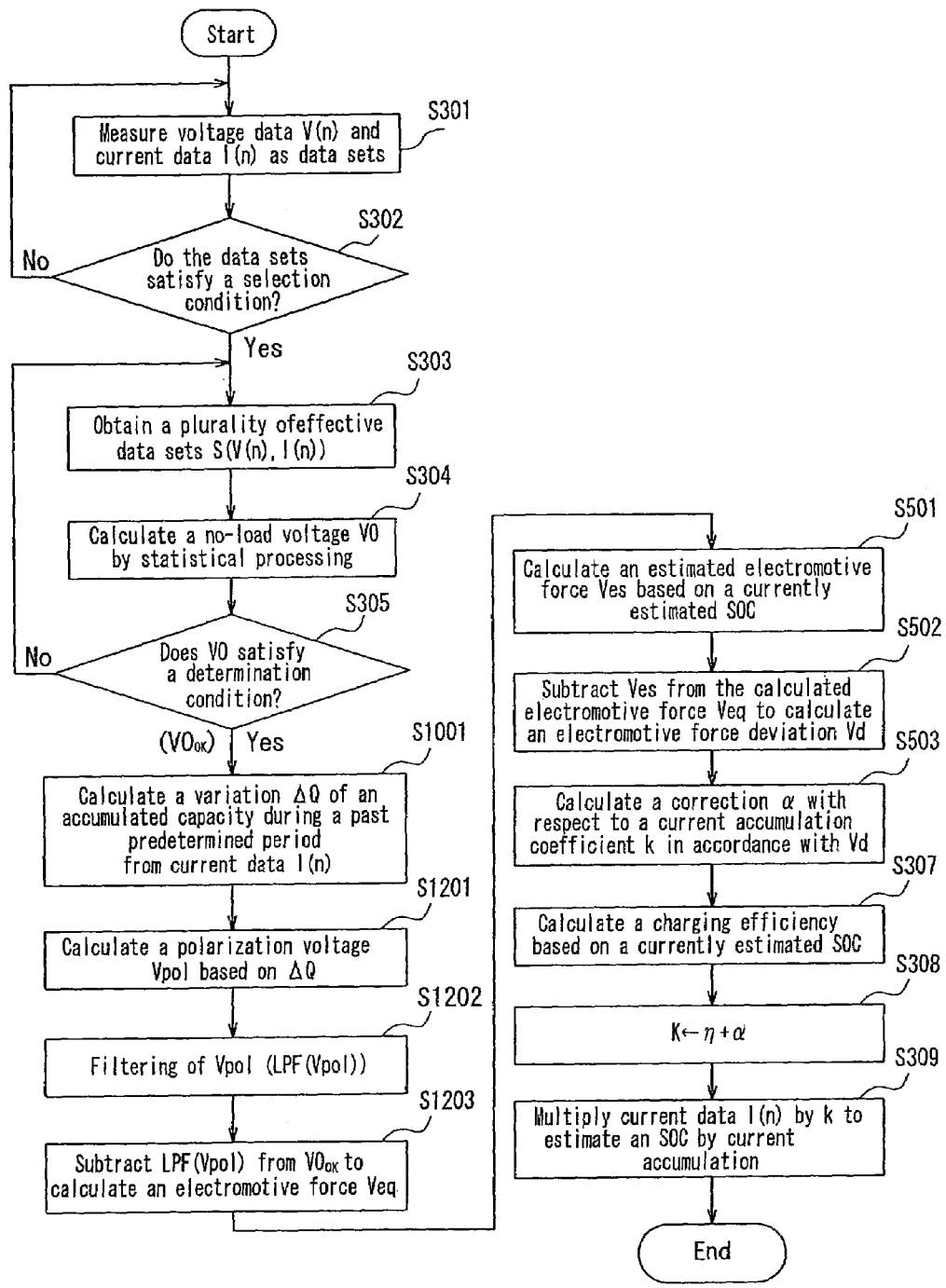
FIG. 12 is a flow chart showing a processing procedure in a method for estimating a remaining capacity of a secondary battery according to Embodiment 4 of the present invention.

FIG. 12 is a flow chart showing the processing procedure in the method for estimating a remaining capacity of a secondary battery according to Embodiment 4 of the present invention. In FIG. 12, the same processing steps as those in FIG. 8 representing the processing procedure of Embodiment 3 are denoted with the same reference numerals as those therein, and the description thereof will be omitted here.

In FIG. 12, the steps up to the determination step of a no-load voltage V0 (S305) and up to the variation calculation step (S1001) of the accumulated capacity are the same as those in Embodiment 3, so that the description thereof will be omitted here.

A polarization voltage Vpol is calculated from the variation ΔQ of the accumulated capacity obtained in Step S1001, based on a look-up table or formula, which stores previous polarization voltage Vpol-ΔQ characteristic data with the temperature data T(n) being a parameter (S1201). Then, the calculated polarization voltage Vpol is subjected to filtering (time delay and averaging processing) to compute LPF (Vpol) (S1202). Then, the polarization voltage LPF (Vpol) after filtering, which was computed in Step S1202, is subtracted from the effective no-load voltage $V0_{OK}$ which was determined in Step S305, to calculate an electromotive force Veq.

The subsequent steps are the same as those in Embodiment 3, so that the description thereof will be omitted here.

As described above, according to the present embodiment, the polarization voltage Vpol is subjected to filtering (time delay and averaging processing), whereby timing adjustment is performed between the no-load voltage V0 and the polarization voltage Vpol, and an appropriate electromotive force Veq can be calculated. Furthermore, a fluctuation component of the polarization voltage Vpol that is not required for calculating the electromotive force Veq can be reduced.

In the above-mentioned Embodiments 2 to 4, a predetermined period for calculating the variation ΔQ of the accumulated capacity is set to be, for example, one minute. However, in the case where the battery pack system is mounted on an HEV, etc., the predetermined period may be varied depending upon a running state of a vehicle. More specifically, in the case where a secondary battery is charged/discharged frequently, the above-mentioned predetermined period is set to be short. In the case where a secondary battery is not charged/discharged frequently, the above-mentioned predetermined period is set to be long. Thus, an optimum polarization voltage can be estimated in accordance with an actual running state.

As described above, according to the present invention, the current accumulation coefficient is corrected in accordance with a battery electromotive force, and an SOC is estimated by current accumulation. Thus, an error due to current accumulation is not accumulated in an SOC intermediate region, and an SOC can be estimated with high accuracy.

Furthermore, the SOC after self-discharging caused by being left for a long period of time, etc. also can be estimated easily, and it is not required to initialize an SOC by performing complete discharging and complete charging periodically.

Furthermore, in the case where the battery pack system is mounted on, for example, an HEV, etc., an SOC can be controlled exactly based on the SOC estimated with high accuracy. More specifically, in the case where the SOC estimated value is determined to be higher than an SOC true value, the charging efficiency is reduced by a correction amount of the current accumulation coefficient. As a result, the SOC estimated value also is decreased at subsequent accumulation, compared with the previous accumulation, so that the SOC estimated value is approximated to the SOC true value. On the other hand, in the case where the SOC estimated value is determined to be lower than the SOC true value, the charging efficiency is added by a correction amount of the current accumulation coefficient. As a result, the SOC estimated value is increased at subsequent accumulation, compared with the previous accumulation, so that the SOC estimated value also is approximated to the SOC true value. Thus, by continuing this control, the SOC estimated value and the SOC true value are managed so as to be always matched with each other, and the deviation of the SOC estimated value with respect to the SOC true value is decreased. This can remarkably enhance the accuracy of energy management of an entire system.

The invention claimed is:

1. A method for estimating a remaining capacity of a secondary battery, comprising the steps of:
    measuring data sets of a current flowing through a secondary battery and a terminal voltage of the secondary battery corresponding to the current, and obtaining a plurality of the data sets;
    calculating an electromotive force of the secondary battery based on the obtained plurality of data sets;
    determining a correction amount with respect to a current accumulation coefficient in accordance with the calculated electromotive force;
    calculating the current accumulation coefficient from the correction amount and a charging efficiency; multiplying the calculated current accumulation coefficient by the measured current, and estimating a remaining capacity of the secondary battery by current accumulation; and
    controlling the remaining capacity by charging or discharging the secondary battery using the estimated remaining capacity of the secondary battery.

2. A method for estimating a remaining capacity of a secondary battery, comprising the steps of:
    measuring data sets of a current flowing through a battery pack including a combination of a plurality of cells that are secondary batteries and used in an intermediately charged state and a terminal voltage of the secondary battery corresponding to the current, and obtaining a plurality of the data sets;
    calculating an electromotive force of the secondary battery based on the obtained plurality of data sets;
    determining a correction amount with respect to a current accumulation coefficient in accordance with the calculated electromotive force;
    calculating the current accumulation coefficient from the correction amount and a charging efficiency;
    multiplying the calculated current accumulation coefficient by the measured current, and estimating a remaining capacity of the secondary battery by current accumulation; and
    controlling the remaining capacity by charging of or discharging the secondary battery using the estimated remaining capacity of the secondary battery.

3. A battery pack system comprising a computer system for executing the method for estimating a remaining capacity of a secondary battery of claim 2, and the battery pack.

4. A motor-driven vehicle on which a battery pack system comprising a computer system for performing the method for estimating a remaining capacity of a secondary battery of claim 2, and the battery pack.

5. An apparatus for estimating a remaining capacity of a secondary battery, comprising:
    a current measuring section for measuring a current flowing through a secondary battery as current data;
    a voltage measuring section for measuring a terminal voltage of the secondary battery corresponding to the current as voltage data;
    an electromotive force calculation section for calculating an electromotive force of the secondary battery based on a plurality of data sets of the current data from the current measuring section and the voltage data from the voltage measuring section;
    a current accumulation coefficient correction section for determining a correction amount with respect to a current accumulation coefficient in accordance with the electromotive force from the electromotive force calculation section;
    an adder for outputting the current accumulation coefficient from the correction amount from the current accumulation coefficient correction section and a charging efficiency; and
    a remaining capacity estimation section for multiplying the current accumulation coefficient from the adder by the current data, and estimating a remaining capacity of the secondary battery by current accumulation.

6. An apparatus for estimating a remaining capacity of a secondary battery, comprising:
    a current measuring section for measuring a current flowing through a battery pack having a combination of a plurality of cells that are secondary batteries and used in an intermediately charged state, as current data;
    a voltage measuring section for measuring a terminal voltage of the secondary battery corresponding to the current as voltage data;
    an electromotive force calculation section for calculating an electromotive force of the secondary battery based on a plurality of data sets of the current data from the current measuring section and the voltage data from the voltage measuring section;
    a current accumulation coefficient correction section for determining a correction amount with respect to a current accumulation coefficient, in accordance with the electromotive force from the electromotive force calculation section;
    an adder for outputting the current accumulation coefficient from the correction amount from the current accumulation coefficient correction section and a charging efficiency; and
    a remaining capacity estimation section for multiplying the current accumulation coefficient from the adder by the current data, and estimating the remaining capacity of a secondary battery by current accumulation.

7. A battery pack system comprising the apparatus for estimating a remaining capacity of a secondary battery of claim 6, and the battery pack.

8. A motor-driven vehicle on which a battery pack system comprising the apparatus for estimating a remaining capacity of a secondary battery of claim 6 and the battery pack is mounted.

* * * * *